United States Patent [19]

Tarng

[11] Patent Number: 5,280,200

[45] Date of Patent: Jan. 18, 1994

[54] PIPELINED BUFFER FOR ANALOG SIGNAL AND POWER SUPPLY

[76] Inventor: Min M. Tarng, 1367 Glenmoor Way, San Jose, Calif. 95129

[21] Appl. No.: 854,800

[22] Filed: Mar. 23, 1992

Related U.S. Application Data

[63] Continuation-in-part of Ser. No. 579,260, Sep. 5, 1990, abandoned, which is a continuation-in-part of Ser. No. 335,584, Apr. 10, 1989, abandoned.

[51] Int. Cl.$^5$ .......................................... H03K 19/086
[52] U.S. Cl. ..................... 307/446; 307/554; 307/451; 307/494; 307/475; 307/546; 307/548
[58] Field of Search ............... 307/554, 562, 451, 494, 307/496, 497, 296.1, 296.8, 475, 546, 548

[56] References Cited

U.S. PATENT DOCUMENTS

| | | | |
|---|---|---|---|
| 4,783,607 | 11/1988 | Hsieh | 307/475 |
| 4,789,799 | 12/1988 | Taylor et al. | 307/562 |
| 4,820,937 | 4/1989 | Hsieh | 307/475 |
| 4,849,659 | 7/1989 | West | 307/475 |
| 4,849,708 | 7/1989 | Brehmer et al. | 307/562 |
| 4,859,878 | 8/1989 | Murayama | 307/446 |
| 4,914,324 | 4/1990 | Goto | 307/562 |
| 4,924,116 | 5/1990 | Vu et al. | 307/554 |
| 5,013,941 | 5/1991 | Jansson | 307/475 |

Primary Examiner—William L. Sikes
Assistant Examiner—Scott A. Ouellette

[57] ABSTRACT

The analog dynamic superbuffer comprises the level shift stage, voltage clamping stage and the dynamic buffer stage. The clamping circuit enables the output buffer having the dynamic driving capability to drive a very large output load with very little static DC bias power consumption.

The TTL power supply is constituted of the stages of TTL power level shift and the analog superbuffer. The huge impact of the power source load is completely blocked by the analog superbuffer.

31 Claims, 12 Drawing Sheets

PIPELINED BUFFER FOR ANALOG SIGNAL AND POWER SUPPLY

This is a continuation-in-part of Ser. No. 07/579,260 Filed Sep. 5, 1990, now abandoned, which is a continuation in part of Ser. No. 07/335,584, now abandoned.

BACKGROUND

1. Field of Invention

This invention is related to an pipelined buffer driving an output voltage to be equal to the voltage of an input analog signal.

2. Description of Prior Art

The analog buffer is to drive the output voltage to be equal to the voltage of an input analog signal. In the prior arts, the analog buffer is a unit gain amplifier. In unit gain amplifier, the output is connected to be one of the inputs of a differential amplifier. In such a circuit configuration, the output load has a direct impact on the input. It takes a long time to be stable. Even worse, the weak input analog signal is destroyed. Furthermore, the output stage of amplifier is constituted of large devices. It consumes a lot of dc bias current. Such a large power consumption is not acceptable for very large scale integration.

I make the innovative design to overcome these problems by decoupling the long global feedback loop to be several local feedback loops. Furthermore, in the high gain amplifier, each feedback loop is constituted of only one MOS gate. To have both accuracy and speed, the key design is the voltage clamping circuit. According to the analog input signal, two clamping voltages are generated with a level shift circuit. The clamping voltages then clamps the output voltage dynamically. If the output voltage is equal to the input voltage, the large output devices are switched off to save power. With the local feedback loops and the voltage clamping circuit, the analog signal can propagate in the pipelined analog buffer. It increases the signal bandwidth and the output load has no impact on the input signal. So far, none of the references has the superior features of this analog buffer.

The pipelined analog buffer has an important application of power supply. One example is the voltage source for the TTL compatible input buffer. The trigger point of the TTL input buffer is about 1.4 volts; the voltage source is about 2.8 volts. The prior arts used the unit gain amplifier to generate the 2.8 volt, such as the U.S. Pat. Nos. 4,783,607 and 4,820,937 issued to Hsieh. His voltage source has a large voltage oscillation of power supply. Furthermore, this voltage oscillation of power supply has the impact on the input reference signal, 1.4 volts. He has to adopt the Schmitt trigger type input buffer to reject the noise caused by TTL power supply. My buffer can serve as the TTL power supply without the noise of power supply. The output load doesn't impact on the input reference signal, either. It is the best TTL power supply for the TTL compatible input buffer.

OBJECTS AND ADVANTAGES

The pipelined analog buffer has the large bandwidth for analog signal. It drives the output load dynamically with little power consumption. The voltage clamping circuit clamps the output voltage to be equal to the input voltage. It isolates the input stage from the output stage. As the output voltage is equal to the input voltage, the clamping circuit disables the output stage. This pipelined analog buffer has other very important applications such as the third level power source for TTL compatible input buffer.

DRAWING FIGURES

FIG. 1A and B is the TTL power supply of the prior arts; (A) is the block diagram of the TTL power supply implemented with unit gain amplifier ; (B) shows the voltage oscillation of the TTL power supply in the prior arts.

FIG. 2 is the block diagram of the pipelined analog buffer serving as the power supply of TTL compatible input buffer. This circuit is referred as a TTL voltage source. It is constituted of the blocks of voltage level shifter L, the voltage clamping sub-circuit C and the voltage clamping output buffer B.

FIG. 3 is the block diagram of the pipelined analog buffer. It drives the voltage of the output load to be equal to the voltage of the input analog signal.

FIGS. 4A and B is the CMOS circuit of the TTL power supply. It is the CMOS version of the block diagram as shown in FIG. 2.

FIG. 5 is the CMOS circuit of the pipelined analog buffer. It is the CMOS version of the block diagram as shown in FIG. 3. This sub-circuit is referred as an analog buffer circuit. The output voltage Vo is equal to the input voltage Vi. The output load has no impact on the input voltage Vi.

FIGS. 6A and B is the level shift circuit for the power supply of the TTL compatible input buffer; (A) is the level shift circuit for the inverter type input buffer; (B) is the level shift circuit for the Schmitt trigger type input buffer. These subcircuits are referred as the voltage level shifter. The output voltage Vttl has the different voltage level from the input reference voltage Vref.

FIG. 7 is the voltage clamping circuit made of the CMOS circuit. It clamps the output voltage of the output buffer in FIG. 4 and FIG. 5. This sub-circuit is referred as a voltage clamping circuit. The voltage Vo is clamped to be equal to the reference voltage Vr.

FIG. 8 is the basic pattern of the dynamic output stage made of the CMOS devices. This sub-circuit is referred as an voltage clamping output buffer. The output voltage Vo is clamped by the voltages Vc1 and Vc2.

FIG. 9 is the equivalent circuit of the voltage clamping output buffer as shown in FIG. 8.

FIGS. 10A and B is the improved version of the voltage clamping output buffer.

Figure 14A:

FIGS. 14A and B is the symbol and the equivalent circuit of the N-NPN BICMOS device. This device has been disclosed in the co-pending patent application filed with Ser. No. 07/577,792 on Sep. 5, 1990.

Figure 15A:
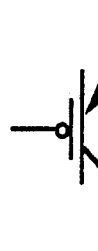

FIGS. 15A and B is the symbol and the equivalent circuit of the P-PNP BICMOS device. This device has been disclosed in the co-pending patent application filed with Ser. No. 07/577,792 on Sep. 5, 1990.

Figure 16A:
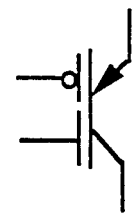

FIGS. 16A and B is the symbol and the equivalent circuit of the PN-PNP BICMOS device. This device has been disclosed in the co-pending patent application filed with Ser. No. 07/577,792 on Sep. 5, 1990.

Figure 17A:
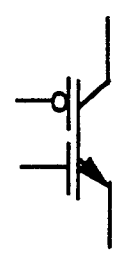

FIGS. 17A and B is the symbol and the equivalent circuit of the PN-NPN BICMOS device. This device has been disclosed in the co-pending patent application filed with Ser. No. 07/577,792 on Sep. 5, 1990.

DESCRIPTION OF THE PREFERRED EMBODIMENTS

Figure 1A:
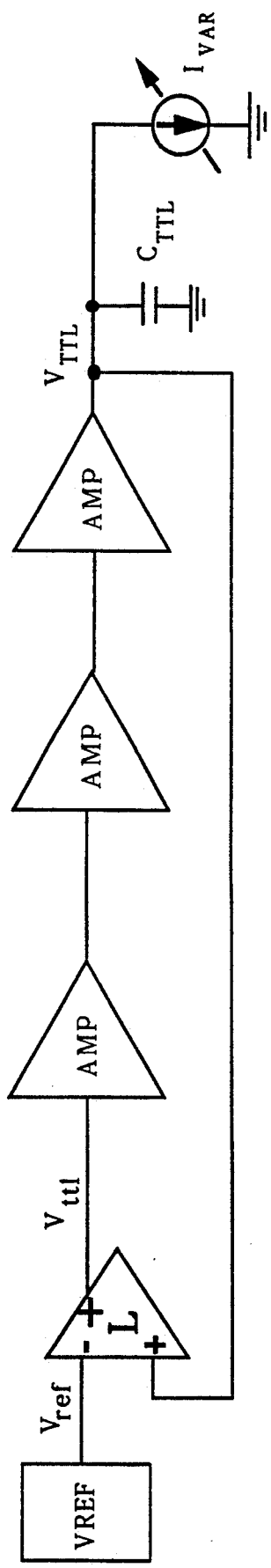
Figure 1B:
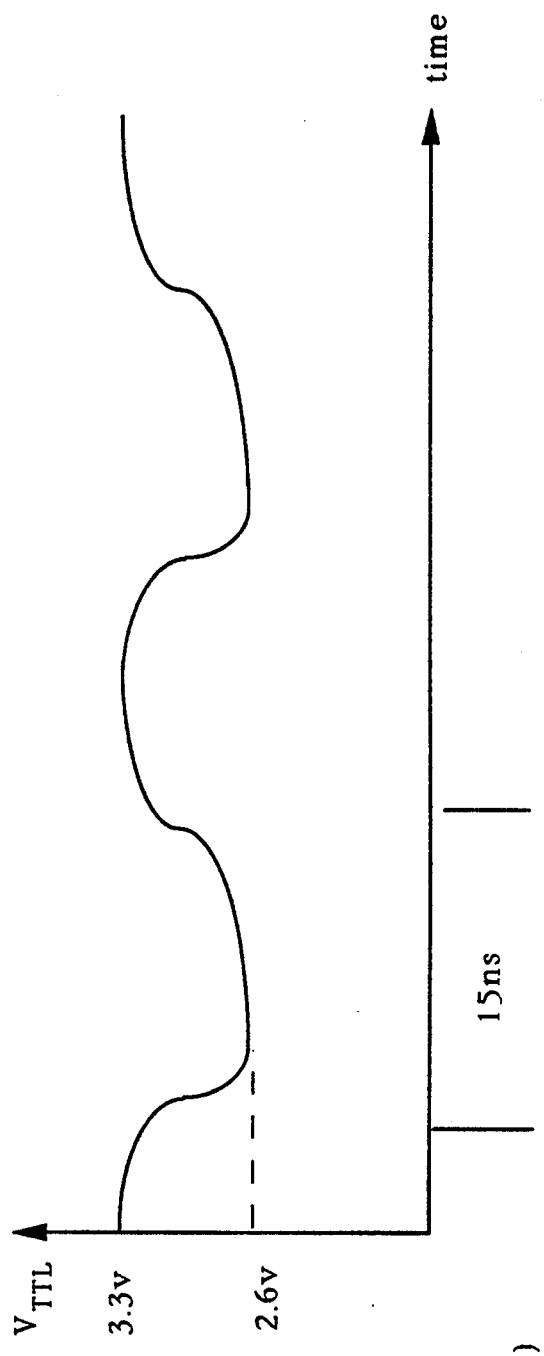

To interface with TTL signal, the CMOS input buffer needs to be TTL compatible. The "one" state of TTL signal level is above 2 volts. For the CMOS input buffer having 5 volts power supply, the DC current is about 0.3 milli-amperes per input buffer. The on-chip TTL power supply is needed to eliminate the DC power consumption of input buffer. In the prior arts, the TTL power supply circuit is a unit gain amplifier. The output is connected to the differential input directly. FIG. 1 is the block diagram of the TTL power supply circuit disclosed in the U.S. Pat. Nos. 4,783,607 and 4,820,937. FIG. 1B is the SPICE simulation result of this TTL power supply circuit. The dynamic varying load IVAR causes the output voltage VTTL to oscillate between 2.6 volts and 3.3 volts. This voltage oscillation has the impact on the reference voltage Vref.

Figure 2:
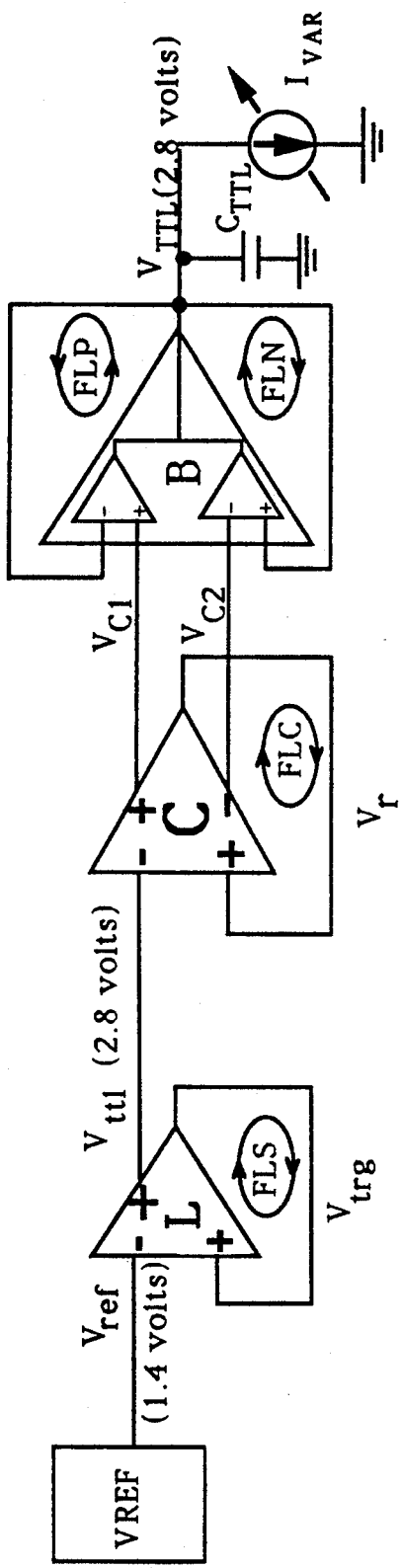

To minimize the voltage oscillation of the TTL power supply, the analog buffer is needed. There are several requirements for the analog buffer. First, the analog buffer makes the output voltage Vo equal to the input voltage Vi for a wide range of input voltage Vi. It needs to sense the variance of the output voltage and charge/discharge current instantly. Second, the buffer is immune from the impact of the output load. Third, the analog buffer must be dynamic: as Vi=Vo, the output driving stage is turned off to save the power consumption. FIG. 2 is the block diagram of my analog buffer applied to the third level TTL power source generator. As shown in FIG. 2, my TTL power supply is made of three stages. The second stage and the third stage are the analog buffer. Each stage has a local feedback loop. The output voltage VTTL has no impact on the input reference voltage Vref.

Figure 4A:
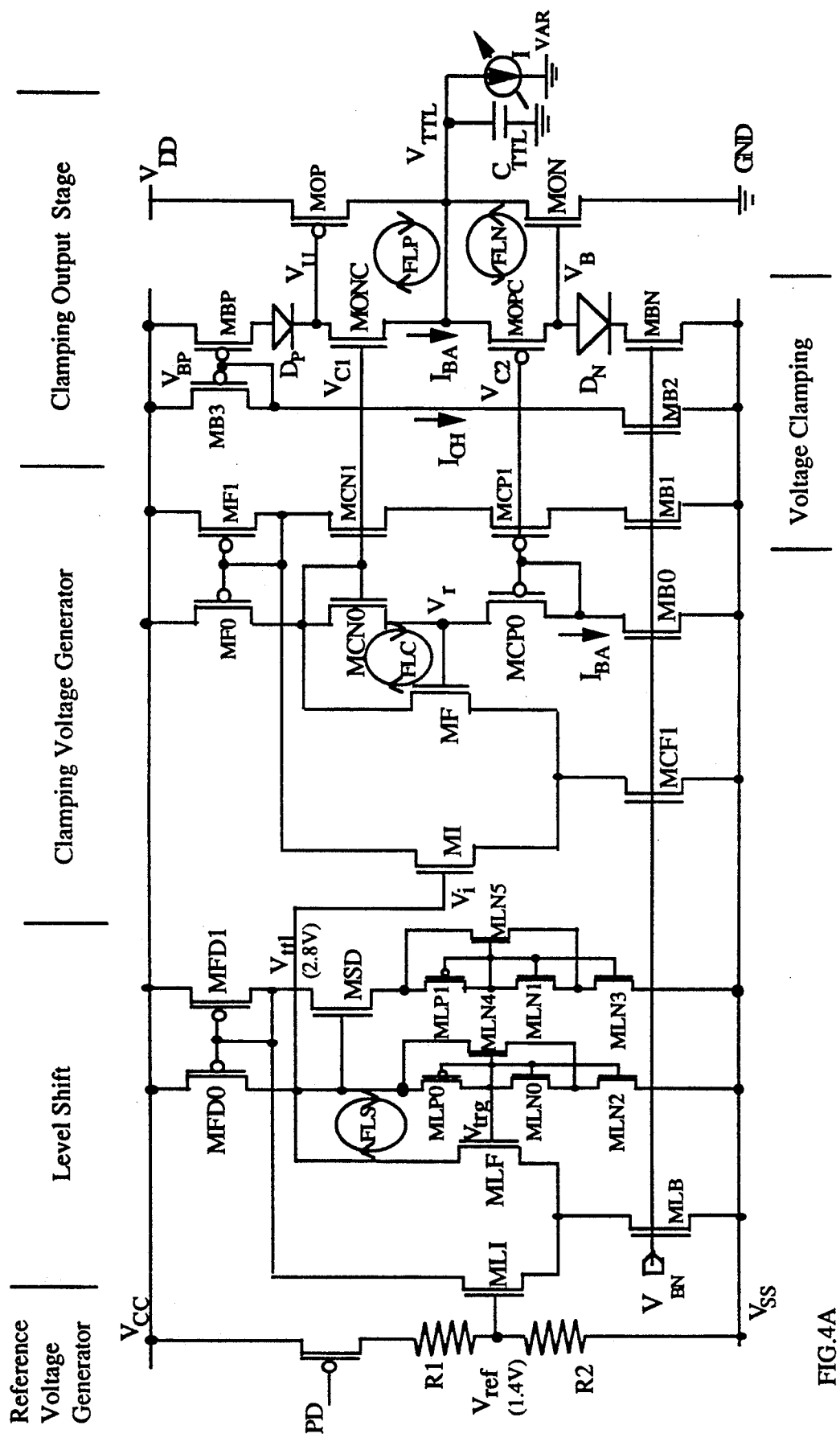
Figure 4B:
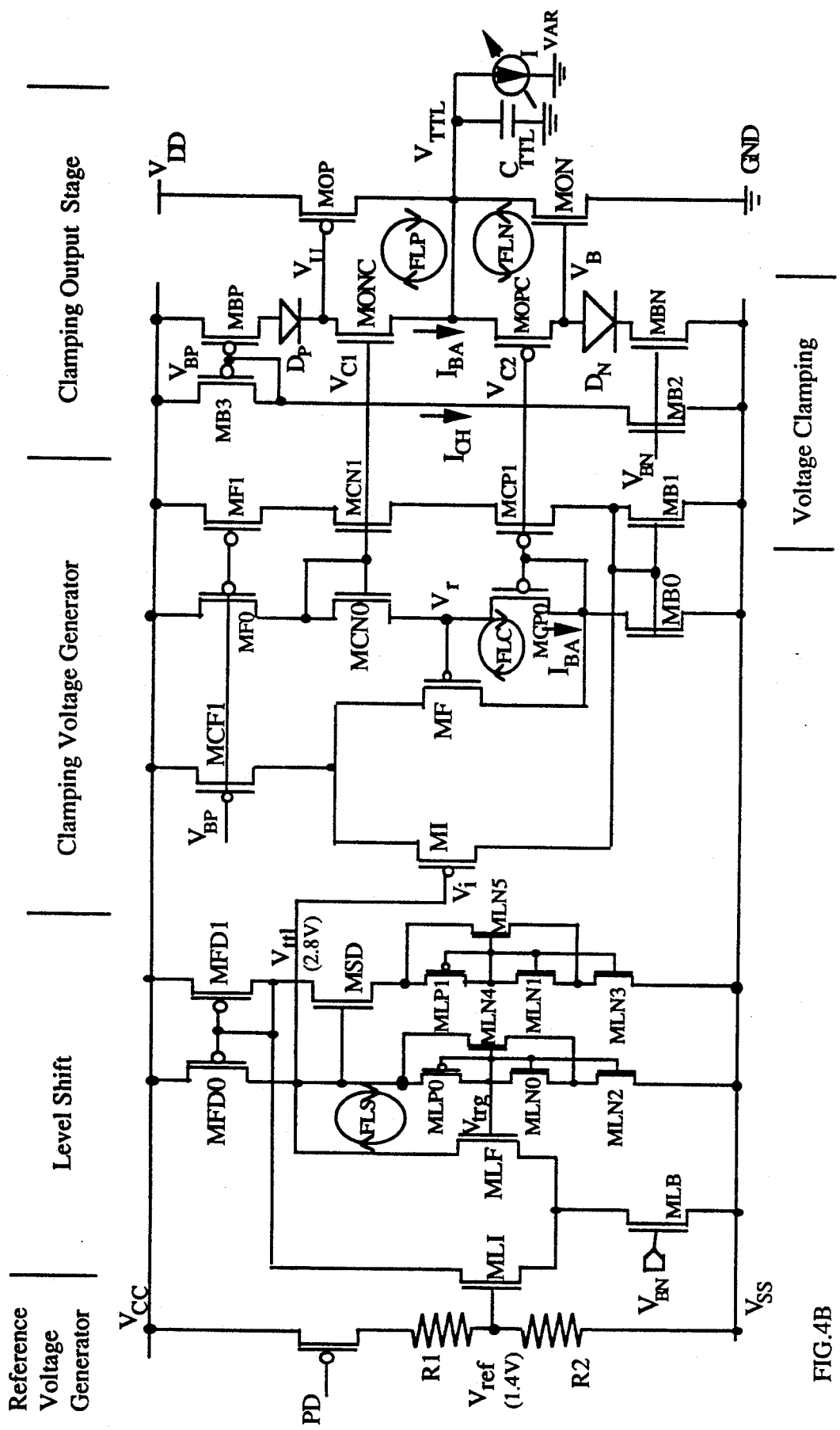

In FIG. 2, the first stage is level shift circuit L generating the TTL power voltage signal Vttl. The feedback signal is the trigger point voltage Vtrg. The reference voltage Vref is set to be 1.4 volt for the trigger point of TTL compatible input buffer. The second stage is the clamping voltage level shift circuit C to generate the clamping voltages VC1 and VC2 for the VTTL power source. The clamping voltages VC1 and VC2 are sent to the third stage output feedback dynamic buffer B to switch the output buffer driver dynamically. The VTTL power generator not only supplies the power dynamically with the minimum DC power consumption but also monitors the variance of power level. The response to the variance of IVAR is fast. FIG. 4 is the complete CMOS circuit corresponding to the block diagram of the TTL power supply as shown in FIG. 2. The local feedback loops are FLS, FLC, FLP and FLN marked in the FIG. 2 and FIG. 4. In FIG. 2, the local feedback loops decouple the circuit to be the pipelined circuit. In FIG. 4A, every local feedback loop is constituted of two gates only. The signal delay in the local feedback loop is one gate delay only. These factors make the pipelined analog buffer have large signal bandwidth. For the TTL power supply circuit, the variance of output load IVAR is large. It has to use the multiple power buses. As shown in FIG. 4, the output stage adopts the dirty power bus VDD and the dirty ground bus GND; the analog circuit adopts the clean power bus Vcc and the clean ground bus Vss.

As shown in FIG. 2 and FIG. 4A, the reference voltage generator VREF is constituted of two resistors R1 and R2. The reference voltage is the trigger point of the input buffer, i.e., 1.4 volts. Adjusting the ratio of R1 and R2, the reference voltage is set to be 1.4 volts. The PD is the power down signal to turn off the TTL power supply circuit.

As shown in FIG. 2 and FIG. 4A, the TTL power supply circuit is decomposed to be the subcircuits of reference voltage generator, level shifter, clamping voltage generator, clamping output stage and the voltage clamping circuit. The details of these sub-circuits are explained in the following specification with the concept of circuit blocks.

Figure 3:
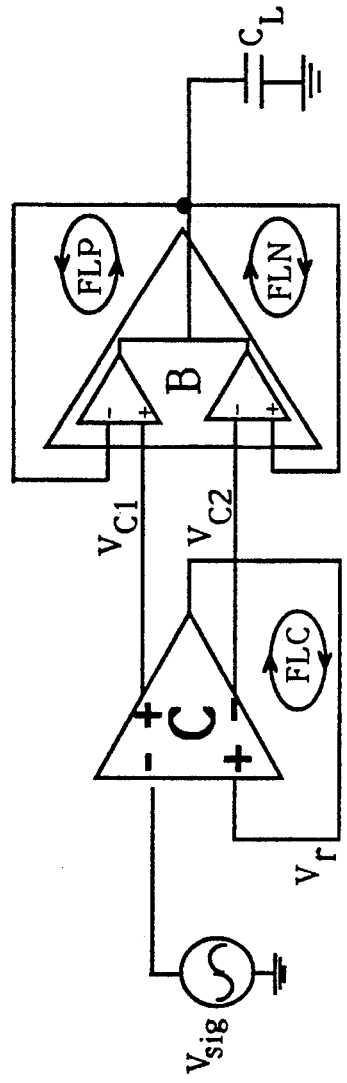
Figure 5:
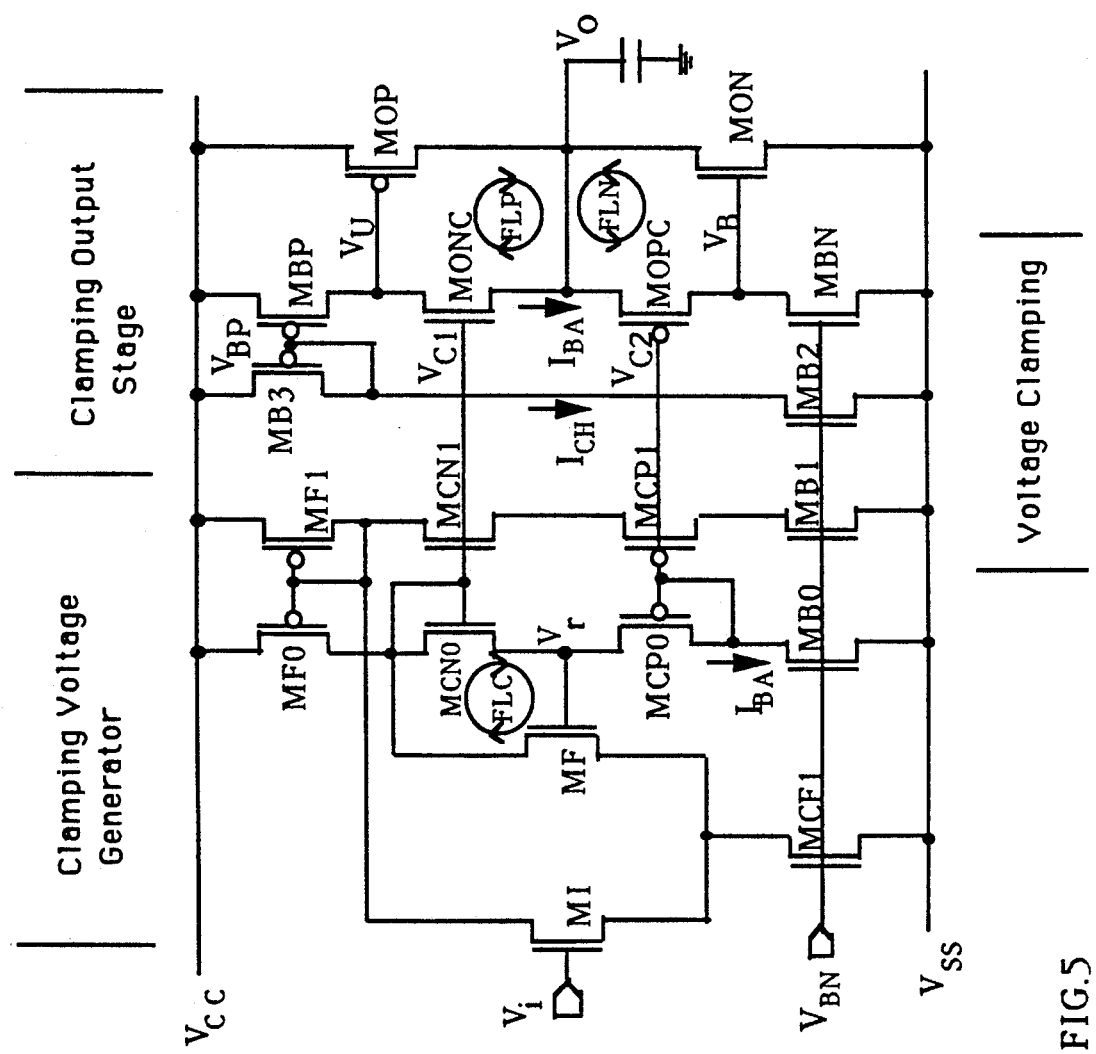
Figure 7:
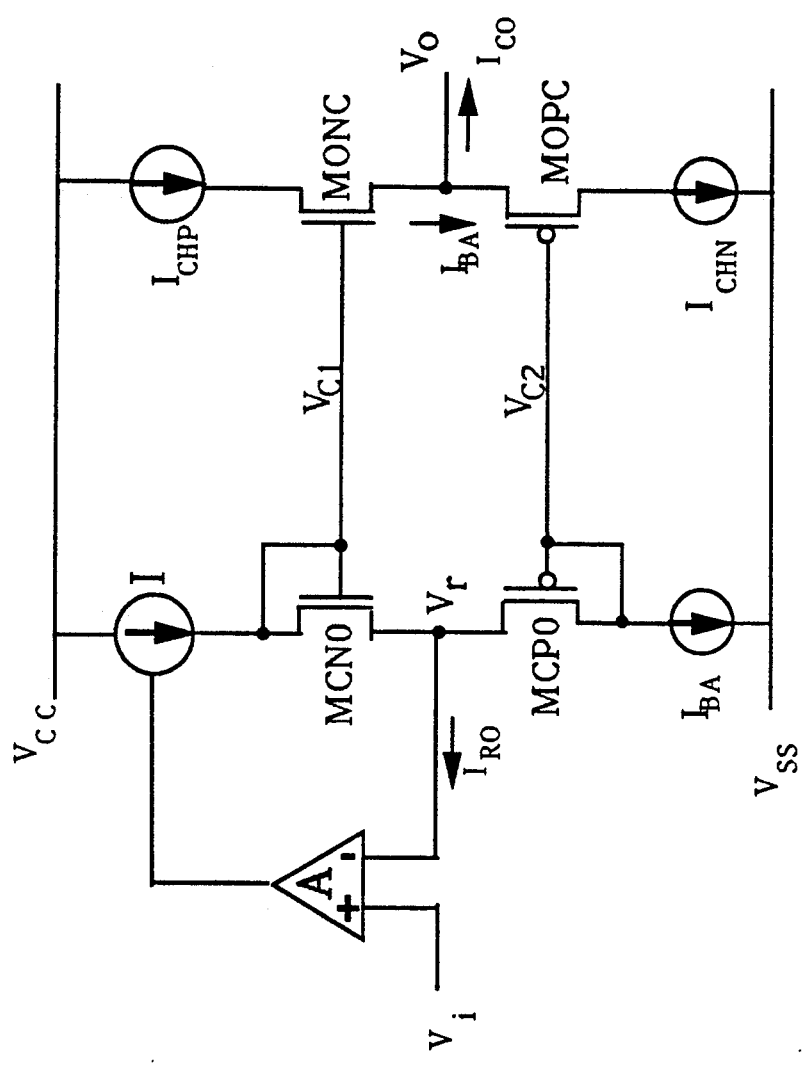

FIG. 3 is the building blocks of pipelined analog buffer. FIG. 5 shows the analog buffer made of CMOS devices. In the analog buffer, there are three stages: the level shift stage, the voltage clamping stage and the voltage clamping output stage. The output portion of level shift stage is the input portion of voltage clamping stage; the output portion of clamping voltage stage is the input portion of the dynamic buffer stage. In FIG. 5, MCNO and MCPO are the output devices of the clamping voltage generator. As shown in FIG. 7, MCNO and MCPO are the input devices of voltage clamping stage. The input devices of dynamic buffer stage in FIG. 9, MONC and MOPC are the output devices of the voltage clamping stage in FIG. 7. So the three-stage structure is reduced to two-stage block diagram as shown in FIG. 3. C is the clamping voltage generator and B is the voltage clamping dynamic output buffer stage.

Figure 12:
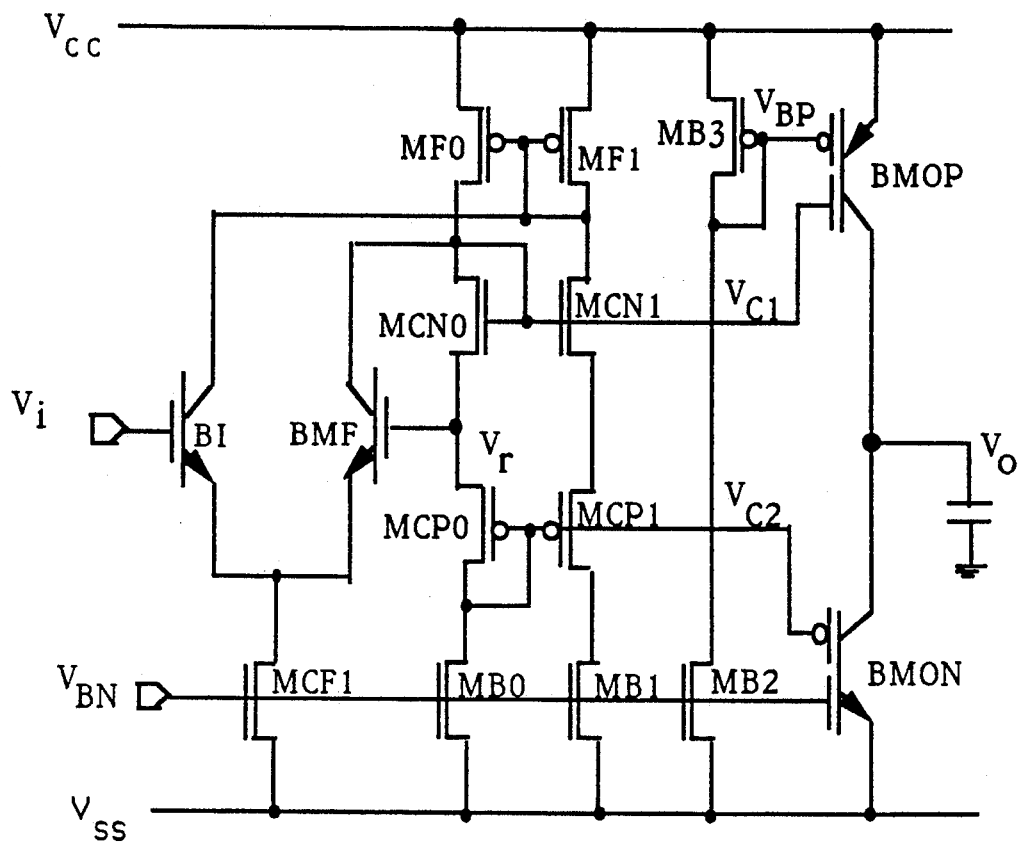
FIG. 12 is the BICMOS analog buffer having the similar circuit configuration as FIG. 5.

FIG. 12 is the analog buffer made of BIMOS devices having the same configuration as FIG. 5. The BiMOS devices had been disclosed in the copending patent application filed with Ser. No. 07/4577,792 on Sep. 5, 1990. The co-pending invention is now granted with a patent filed with Ser. No. 07/577,792 which is the continue-in-part of the parent invention filed with Ser. No. 07/335,584 on Apr. 4, 1989, now abandoned. The operations of the BiMOS analog buffer are similar to the CMOS circuit. With minor modifications, the discussions made for the CMOS circuit in FIG. 5 are valid for BiMOS circuit in FIG. 12. In the following discussions, we emphasize the analysis on CMOS analog buffer. It is noted that the differential amplifier can be flipped over with the substitutions of NMOS devices with PMOS devices in the differential pairs. For example, in FIG. 4B, the NMOS device MI, MF and MCF1 are substituted with the PMOS devices.

Referring to FIG. 5, the level shift circuit is a unit gain folding cascade amplifier. The output Vr of the folding cascade amplifier is connected to one differential input of NMOS device MF. It is a unit gain amplifier that the input voltage Vi is equal to the output voltage Vr. The feedback path in the local feedback loop FLC is constituted of MF and MCNO.

As the input voltage Vi increases, the gate voltage of PMOS devices MF0 and MF1 is pulled low. A lot of current is injected into the drain of NMOS device MCN0. The voltage Vr increases. As Vr increases, the negative feedback CMOS device MF in FIG. 5(the BiMOS device BMT in FIG. 12) drains the current from the drain of MCN0 to stabilize Vr. As the input voltage Vi decreases, the gate voltage of PMOS devices MF0 and MF1 increases. The current injecting into the drain of MCN0 decreases. The voltage Vr decreases. As Vr decreases, the device MF in FIG. 5( BMF in FIG. 12) drains less current from the drain of MCN0. This negative feedback makes the Vr follow the input voltage to achieve Vr=Vi.

Figure 6A:
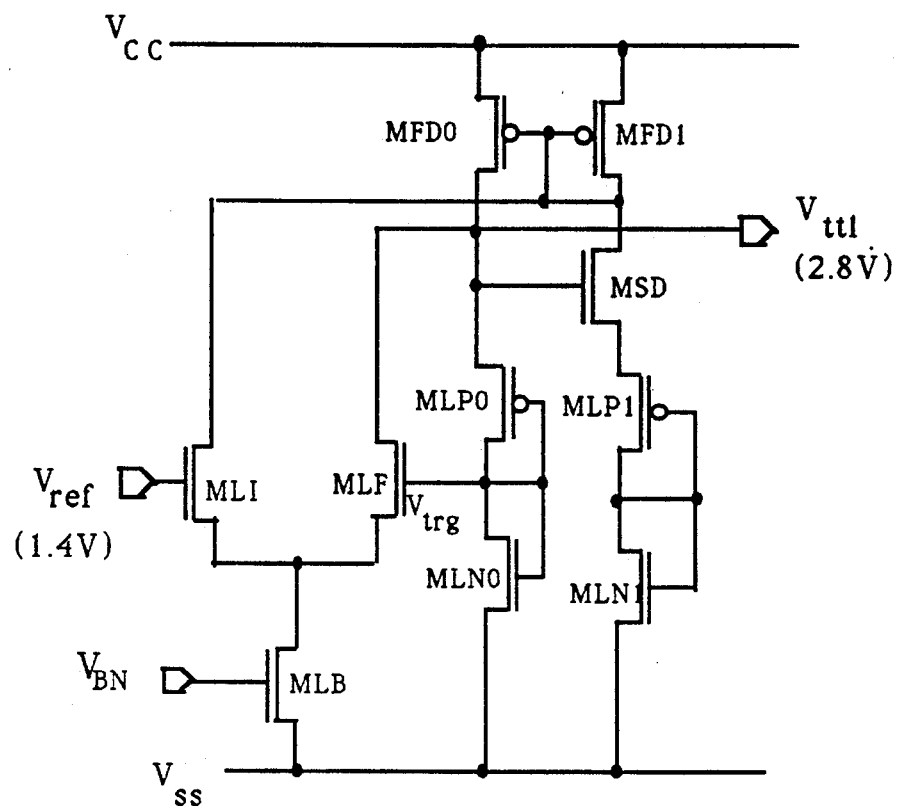
Figure 6B:
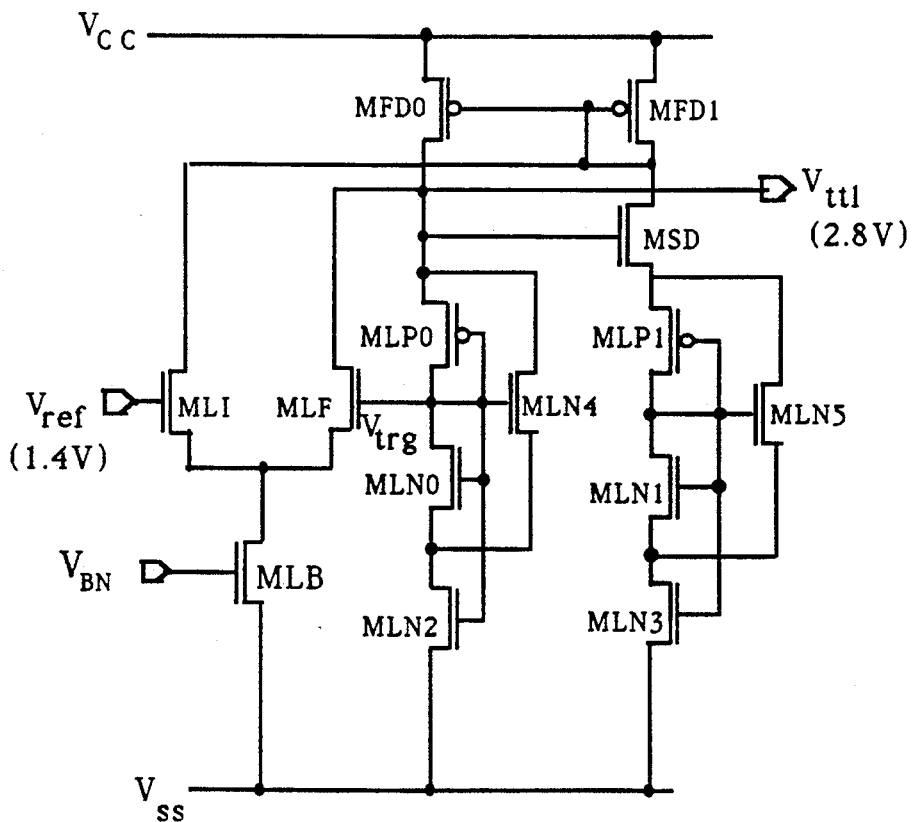

FIG. 6 is the level shift circuit to generate the voltage for the TTL power supply. FIG. 6A is the level shift circuit for the inverter type input buffer; FIG. 6B is the level shift circuit for the Schmitt type input buffer. These circuit configurations are similar to the circuit configuration as shown in FIG. 5. The feedback signal is the voltage of the trigger point of the input buffer. The voltage splitting device MSD is to split the voltages between the voltage (VCC−VTH,P) at the drain of PMOS MFD1 and the voltage (VTH,N+VTH,P) at the source of PMOS device MLP1. The voltage at the drain of MFD1 is clamped to be (VCC−VTH,P).

The reference voltage is set to be 1.4 volts. The unit gain amplifier will adjust the voltage Vttl to make the voltage of the trigger point Vtrg to be equal to the Vref, 1.4 volts. By definition, the voltage Vttl is the voltage level of TTL power supply.

FIG. 7 is the clamping voltage level shift circuit which supplies the clamping voltages Vc1 and Vc2 for the output stage. IBA is the biasing current. The differential amplifier A makes the voltage Vr be equal to Vi without drawing any current from the node Vr. The differential amplifier has the high input impedance. The output of differential amplifier A controls the variable current source 1. The variable current source may be a PMOS with the source connected to the power supply or the NMOS with the source connected to the ground. The differential amplifier A can be the folding cascade amplifier as shown in FIG. 5. The local feedback loop FLC is constituted of MF and MCN0 only. The differential amplifier has zero input current, IRO=0. If there is no output current flowing out Vo node, Ico=0, the output voltage Vo is clamped to be equal to the reference voltage Vr, Vo=Vr=Vc1−VTH,N=Vc2+VTH,P, where VTH,N is the threshold voltage of NMOS and V TH,P is the threshold voltage of PMOS. From the above relations, as IRO=ICO=0, Vo=Vr=Vi. It is the basic equation of the analog buffer.

Figure 8:
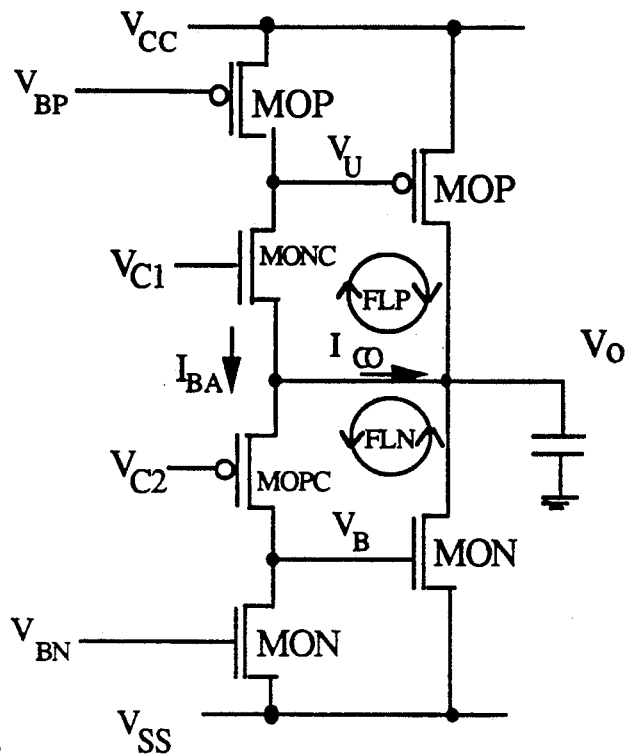
Figure 9:
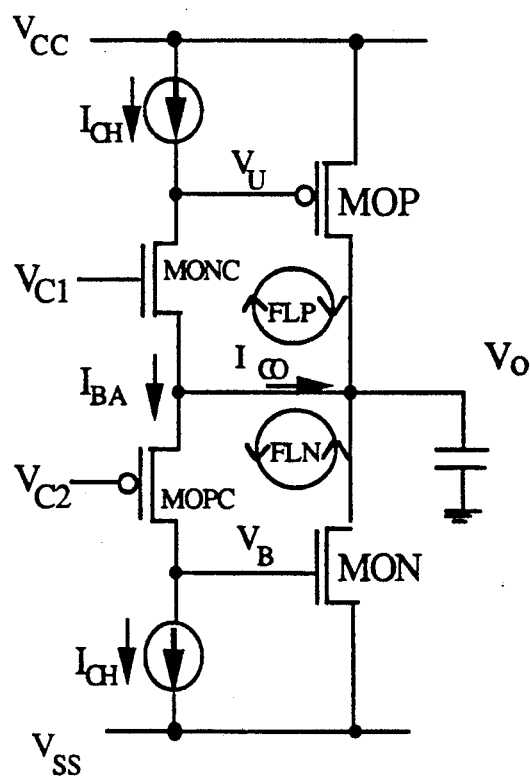

FIG. 9 is the equivalent circuit for the voltage clamping dynamic output stage as shown in FIG. 8. Referring to FIG. 5, FIG. 8 and FIG. 9, the DC bias current IBA flowing through the MONC and MOPC is clamped to be the DC bias current flowing through the MCN0 and MCPO. As shown in FIG. 5, the DC biased current IBA is controlled by the NMOS device MB0. The DC biased current of MONC and MOPC is controlled by the clamping circuit to be IBA. The (W/L) ratio of NMOS device MBN is larger than the (W/L) ratio of NMOS device MB0. The (WAL) ratio of NMOS device MB2 is equal to the (W/L) ratio of NMOS device MBN. The (WAL) ratio of PMOS device MBP is equal to the (WAL) ratio of PMOS device MB3. The DC biased current ICH flows through the MB2 and MB3. ICH is larger than IBA. Under the charging of the PMOS device MBP, the voltage Vu is equal to Vcc. The output stage PMOS device MOP is turned off. Under the discharging of the NMOS device MBN, the voltage VB is equal to the ground voltage GND. The output stage NMOS device MON is turned off. At the equilibrium state, the output stage is completely shut down.

As Vo=Vr, the clamping devices MONC and MOPC only drain a little DC bias current. The devices of current source, MBP and MBN, supply a lot of current. The voltage Vu is charged up to VCC; the voltage VB is discharged to ground. So the output push-pull devices MOP and MON are turned off as Vo=Vr. As the output voltage is equal to the reference voltage Vr, the output stage push-pull device is completely turned off and Ico=0.

The dynamic buffer has the dynamic current switching effect. Only as the Vo is not equal to the reference voltage Vr, the output stage devices MOP and MON are turned on.

If Vo<Vr, the device MONC drains a large amount of current that the voltage Vu is pulled down. The PMOS device MOP is turned on that a lot of current is drained to charge up the output voltage Vo.

If Vo>Vr, the PMOS device MOPC drains a lot of current that the voltage VB is charged up. The NMOS device MON is turned on that a lot of current is drained to discharge the output voltage Vo.

Figure 10A:
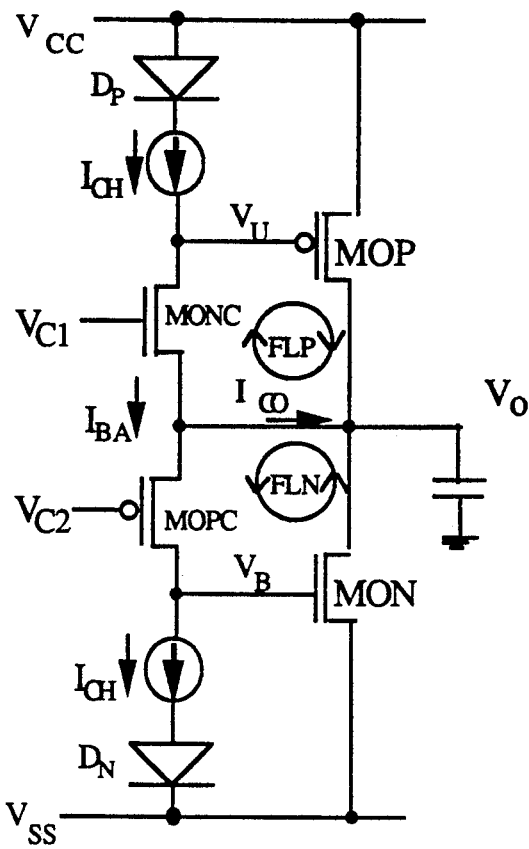
Figure 10B:
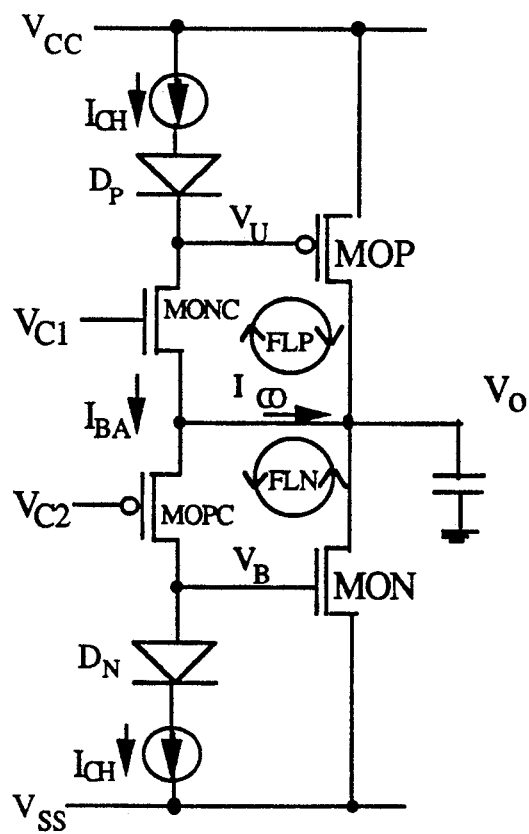

FIG. 10 is the alternative design of the dynamic output stage of the pipelined analog buffer. To speed up the response to the variance of output voltage Vo, the diode Dp is introduced to bias the PMOS device MOP near the voltages to switch on the devices MOP. The diode DN is introduced to bias the NMOS device MON near switching-on voltage. FIG. 10A and FIG. 10B show the two different ways of the implementations.

Figure 11:
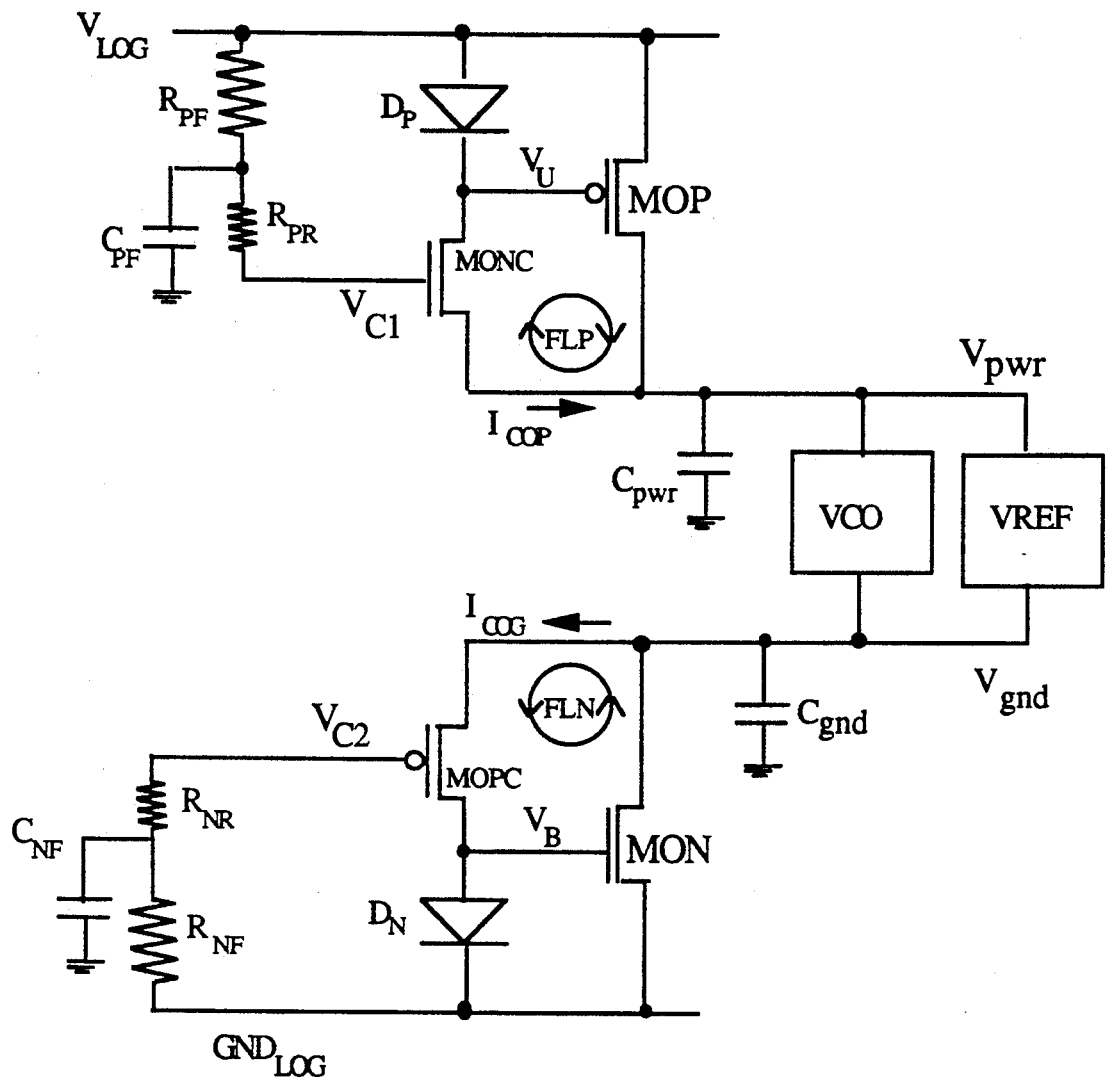
FIG. 11 is the extended version of the voltage clamping output buffer to supply the on-chip clean power bus and clean ground bus to the analog circuits.

FIG. 11 is the application of the voltage clamping output buffer. To have the analog circuit to function properly, the clean power bus and clean ground bus are very important. In FIG. 11, the first RC filter is constituted of RPF, RPR and CPF. It rejects the noise of the power bus VLOG. The second RC filter is constituted of RNF, RNR and CNF. It rejects the noise of the power bus GNDLOG. Vc1 is the average value of the VLOG; VC2 is the average value of the GRDLOG. The voltages VCg1 and VC2 are clean. As Vpwr is less than (VC1−Vth,P), MONC is turned on which then turn on the PMOD device MOP to charge up Vpwr. As Vpwr is larger than (VC1−Yth,P), MOP is turned off. As Vend is larger than (VC2+Vth,N), MOPC is turned on which then turn on the NMOS device MON to discharge Vgnd. As Vpwr is less than (VC2+Vth,N), MON is turned off. The voltage VC1 clamps the voltage Vpwr to be clean bus. The voltage VC2 clamps the Vend bus to be clean ground bus. The voltage clamping output buffer circuit can supply the clean power and clean ground bus to the noise-sensitive circuit such as the voltage controlled oscillator VC0 and the reference voltage generator VREF, etc. As shown in FIG. 2 and FIG. 4, the TTL level reference voltage Vref, 1.4 volts, can be generated with the voltage reference generator VREF.

Figure 14B:
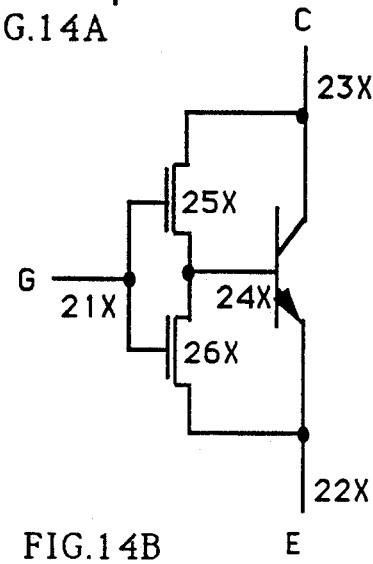

FIG. 12 is the BICMOS analog buffer having the similar circuit configuration as FIG. 5. The BiMOS devices are the co-pending invention filed with Ser. No. 07/577,792 on Sep. 5, 1990. The co-pending invention is the continue-in-part of the parent invention filed with Ser. No. 07/335,584 on Apr. 4, 1989, now abandoned. The operation of BiMOS dynamic buffer is easily understood with the CMOS dynamic buffer. The differential input NMOS devices MI and MF are replaced with the N-NPN BiMOS devices BMI and BMF. The symbol and equivalent circuit of N-NPN BiMOS device are shown in FIG. 14. Referring to FIG. 14, the input signal is applied on the gate terminal 21x. The input signal is transformed into the variance of the base current flowing into the base of the NPN bipolar device 24x. The bipolar amplifies the base current according to the current gain of the NPN bipolar device. A gate voltage signal is amplified to be a large emitter current signal by the N-NPN Bi-MOS device.

Figure 16B:
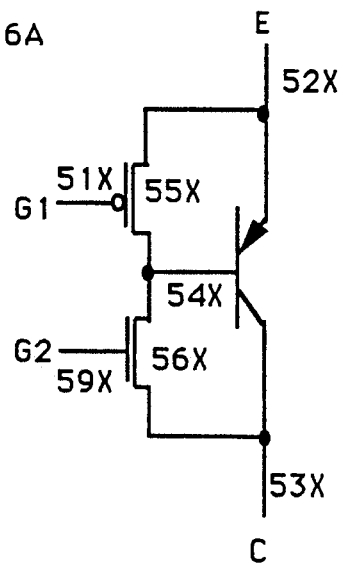
Figure 17B:
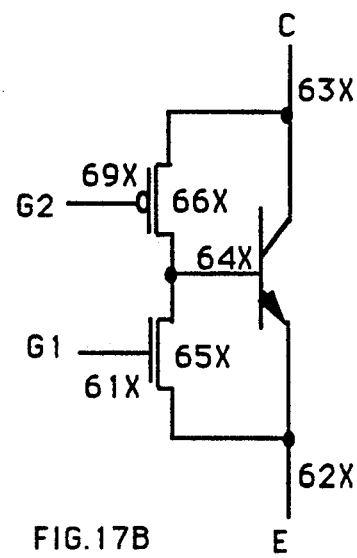

Referring to FIG. 16 and FIG. 12, the gate G1(51X) of PN-PNP BiMOS is biased with the voltage to be the current source; the gate G2(59X) of PN-PNP BiMOS is the clamping voltage VC1=Vi+Vth,N. Referring to FIG. 17 and FIG. 12, the gate G1(61X) of PN-NPN BiMOS is biased with the voltage to be the current source; the gate G2(69X) of PN-NPN BiMOS is the clamping voltage VC2=Vin−Vth,P.

Figure 15B:
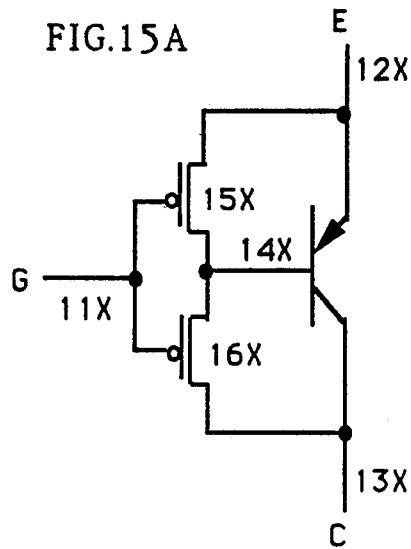

The differential input stage NMOS devices in FIG. 5 can be replaced with PMOS devices. Correspondingly, the differential input N-NPN devices may be replaced with the P-PNP BiMOS devices. The symbol and equivalent circuit of the P-PNP BiMOS device are shown in FIG. 15. Referring to FIG. 15, the input signal is applied on the gate terminal 11x. The input signal is transformed into the variance of the signal of base current flowing out of the base of the PNP bipolar device 14x. The bipolar amplifies the base current according to the current gain of the PNP bipolar device. A gate voltage signal is amplified to be large emitter current signal by the P-PNP BiMOS device.

Figure 13:
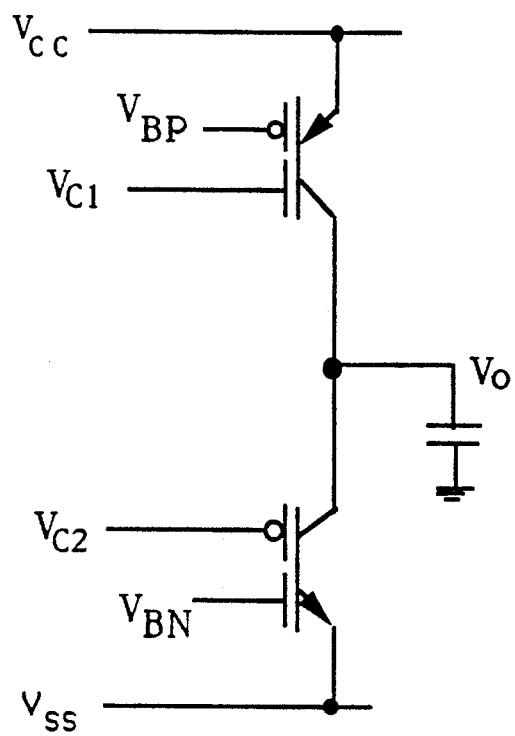
FIG. 13 is the voltage clamping output buffer made of the BICMOS devices.

FIG. 13 is the buffer stage of the BiMOS analog buffer. It is the BICMOS output feedback buffer circuit having the same circuit configuration as FIG. 9. The single stage BICMOS dynamic output buffer stage is made of the complementary PN-PNP BiMOS device and the PN-NPN BiMOS device. VC1 and VC2 are the clamping voltages to clamp the output voltage Vo. VBN and VBP are the bias voltages corresponding to the bias voltages as shown in FIG. 5. The bias voltage VBP is applied on the G1 terminal to generate the bias current. The symbol and equivalent circuit for the PN-PNP BiMOS device is shown in FIG. 16. The bias voltage VBN is applied on the G1 terminal to generate the bias current. The symbol and equivalent circuit for the PN-NPN BiMOS device is shown in FIG. 17.

In summary, as shown in FIG. 2 and FIG. 4, the TTL power signal level shift circuit uses the folding cascade amplifier with input buffer as the load. The feedback signal is the trigger point voltage Vtrg.

The negative feedback loop for the Vtrg signal is only the transistors MLF and MLP. It is so short that the circuit has very fast response to correct the power signal disturbance. The impact of the VTTL power supply is buffered by the analog buffer. The reference signal has almost no disturbance. The clamping circuit clamps the output with the fast response of short negative feedback loop. The impact of VTTL power source transmitted to the power signal Vttl is small. The variance of Vttl signal on the power signal level shift circuit is negligible. It eliminates the need for the large capacitance. The output feedback dynamic power switching capability of the output buffer makes the output buffer to be small. Comparing the size of the VTTL power source generator with the prior arts, the total layout area of my invention is much smaller. With the pipelined analog buffer, the TTL power supply circuit is compact, DC power conservative and with superior power driving capability.

In the above discussions, the circuits are illustrated. While the invention has been particularly shown and described with reference to the preferred embodiments thereof, it will be understood by those skilled in the art that various changes in form and detail may be made therein without departing from the spirit and scope of the invention.

What I claim is:

1. A circuit for voltage clamping comprising a voltage clamping subcircuit to generate a pair of clamping voltages to clamp an output voltage to be equal to an input voltage, said voltage clamping subcircuit comprising a first supply voltage,
   a second supply voltage,
   an input terminal,
   a first output clamping voltage,
   a second output clamping voltage,
   an N-type transistor having a gate and a drain connected together,
   a P-type transistor having a gate and a drain connected together to generating said first output clamping voltage, and having a source connected to a source of said N-type transistor,
   a differential amplifier having a first input from said input terminal and
   a second input from the source of said N-type transistor,
   a first current source connected with said first supply voltage and the drain of said N-type transistor, an output of said differential amplifier being coupled to said first current source to form a feedback loop,
   a second current source being connected with said second supply voltage and the drain of said P-type transistor, said P-type transistor having said drain and a gate connected together to generate said second output clamping voltage.

2. A circuit for voltage clamping as claimed in claim 1, wherein said N-type transistor is an NMOSFET and said P-type transistor is a PMOSFET.

3. A circuit for voltage clamping as claimed in claim 1, wherein said N-type transistor is an N-FET and said P-type transistor is a P-FET.

4. A circuit for voltage clamping comprising an output buffer, said output buffer comprising an output stage, a feedback stage, an output terminal and two clamping input voltages, said output stage comprises a first P-type transistor having a drain connected with an output terminal and a source connected with a first supply voltage,
   a first N-type transistor having a drain connected with said output terminal and a source connected with a second supply voltage,
   said feedback stage comprises a second P-type transistor, a second N-type transistor, a first current source and a second current source,
   said first current source being coupled between said first supply voltage and a drain of said second N-type transistor and having an, output connected to a gate of said first P-type, transistor,
   said second current source being coupled between said second supply voltage and a drain of said second P-type transistor and having an output connected to a gate of said first N-type transistor,
   said second N-type transistor having a first clamping voltage as a gate control and said second P-type transistor having a second clamping voltage as a gate control,
   a source of said second N-type transistor being connected with a source of said second P-type transistor and said output terminal.

5. A circuit for voltage clamping as claimed in claim 4, wherein said P-type transistors are PMOS devices and said N-type transistors are NMOS devices.

6. A circuit for voltage clamping as claimed in claim 4, wherein said first P-type transistor is a PNP bipolar device, said first N-type transistor is an NPN bipolar device, said second P-type transistor is a PMOS device and said second N-type transistor is an NMOS device.

7. A circuit as claimed in claim 4, wherein said P-type transistors are P-FET devices and said N-type transistors are N-FET devices.

8. A circuit as claimed in claim 4, further comprising a first diode and a second diode, said first diode having a P side connected to said first supply voltage and an N side connected to said first current source, said second diode having a P side connected to said second current source and an N side connected to said second supply voltage.

9. A circuit as claimed in claim 4, further comprising a first diode and a second diode, said first diode having a P side connected to said first current source and an N side connected to the drain of said second N-type transistor, said second diode having a P side connected to the drain of said second P-type transistor and an N side connected to said second current source.

10. A circuit for voltage clamping comprising an output buffer, said output buffer comprising a first supply voltage, a second supply voltage, an output terminal, a first BiMOS subcircuit and a second BiMOS subcircuit, each BiMOS subcircuit having two gate controls, said first BiMOS subcircuit comprising a PNP bipolar device, a first PMOS device and a first NMOS device, said first PMOS device being gate controlled by a first biasing voltage and said first NMOS device being gate controlled by a first clamping voltage, a source of said first PMOS device and an emitter of said PNP bipolar device being connected together and coupled to said first supply voltage, a drain of said first PMOS device and a drain of said first NMOS device being connected together and coupled to a base of said PNP bipolar device, a source of said first NMOS device and a collector of said PNP bipolar device being connected together and coupled to said output terminal, said second BiMOS subcircuit comprising an NPN bipolar device, a second PMOS device and a second NMOS device, said second NMOS device being gate controlled by a second biasing voltage and said second PMOS device being gate controlled by a second clamping voltage, a source of said second PMOS device and a collector of said NPN bipolar device being connected together and coupled to said output terminal, a drain of said second PMOS device and a drain of said second NMOS device being connected together and coupled to a base of said NPN bipolar device, a source of said second NMOS device and an emitter of said NPN bipolar device being connected together and coupled to said second supply voltage.

11. A circuit for voltage clamping comprising a voltage clamping subcircuit and an output buffer, said voltage clamping subcircuit comprising means for generating a pair of clamping voltages comprising a first clamping voltage and a second clamping voltage, said output buffer comprising an output terminal,
a first pair of transistors comprising a first N-type transistor and a first P-type transistor connected in series and having their sources connected together and coupled to said output terminal, said first N-type transistor having a gate connected to said first clamping voltage, said first P-type transistor having a gate connected to said second clamping voltage, said first pair of transistor having a drain output from each transistor,
a second pair of transistors comprising a second P-type transistor and a second N-type transistor connected in series and having their drains connected together to said output terminal, said second P-type transistor having a gate connected to a drain output of said first N-type transistor, said second N-type transistor having a gate connected to a drain output of said first P-type transistor, a source of said second P-type transistor being connected to a first supply voltage and a source of said second N-type transistor being connected to a second supply voltage, a first current source connected between said first supply voltage and a drain output of said first N-type transistor,
a second current source connected between said second supply voltage and a drain output of said first P-type transistor.

12. A circuit for voltage clamping as claimed in claim 11, wherein said means of generating two clamping voltages comprises a differential amplifier transistor pair comprising a third N-type transistor and a fourth N-type transistor,
said third N-type transistor having a gate connected to an input terminal, and a drain connected a gate of a third P-type transistor, a gate and a drain of a fourth P-type transistor and a drain of a sixth N-type transistor,
said fourth N-type transistor having a drain connected to a drain of said third P-type transistor, a gate and a drain of a fifth N-type transistor and a gate of said sixth N-type transistor,
a source of said third P-type transistor and a source of said fourth P-type transistor being connected to said first supply voltage,
said fifth N-type transistor being connected to a fifth P-type transistor having sources as a common node connected to a gate of said fourth N-type transistor, said sixth N-type transistor having a source connected to a source of a sixth P-type transistor,
said fifth P-type transistor having a gate connected with a drain and connected to a gate of said sixth P-type transistor and a drain of a seventh N-type transistor, said sixth P-type transistor having a drain connected to a drain of an eighth N-type transistor,
a source of said third N-type transistor and a source of said fourth N-type transistor being connected together to a drain of a ninth N-type transistor,
each of said seventh, eighth and ninth N-type transistors having a gate connected to an external biasing voltage and a source connected to said second supply voltage.

13. A circuit for voltage clamping as claimed in 12, wherein said N-type transistors are NMOS's and said P-type transistors are PMOS'S.

14. A circuit for voltage clamping as claimed in claim 11, wherein said N-type transistors are NMOS's and said P-type transistors are PMOS'S.

15. A circuit for voltage clamping as claimed in claim 11, wherein said first current source comprises a third P-type transistor having a source connected to said first supply voltage, a drain connected to a drain output of said first N-type transistor and a gate connected to a gate and a drain of a fourth P-type transistor, said fourth P-type transistor having a source being connected to said first supply voltage and having its gate and drain connected to a drain of a N-type transistor, said third N-type transistor having a gate controlled by an external biasing voltage and having a source connected to said second supply voltage.

16. A circuit for voltage clamping as claimed in claim 15, wherein said N-type transistors are NMOS's and said P-type transistors are PMOS's.

17. A circuit for voltage clamping as claimed in claim 11, wherein said second current source comprises a transistor having a drain connected to a drain of said first P-type transistor, a source connected to said second supply voltage and a gate connected to an external biasing voltage.

18. A circuit for voltage clamping as claimed in claim 11, wherein said second N-type transistor is an NPN bipolar and said second P-type transistor is a PNP bipolar with said gates, sources, and drains being the corresponding bases, emitters and collectors.

19. A circuit for voltage clamping comprising
an input terminal,
a first and a second output clamping voltage,
a differential amplifier comprising a first N-type transistor and a second N-type transistor,
said first N-type transistor having a first gate terminal connected to an input terminal, and a first drain terminal connected to a gate of a first P-type type transistor, a gate and a drain of a second P-type transistor and a drain of a fourth N-type transistor,
said second N-type transistor having a second drain terminal connected to a drain of said first P-type transistor, a gate and a drain of a third N-type transistor and a gate of said fourth N-type transistor,
a source of said first P-type transistor and a source of said second P-type transistor being connected to a first supply voltage,
said third N-type transistor being connected to a third P-type transistor having sources as a common node connected to a gate terminal of said second N-type transistor, said fourth N-type transistor having a source connected to a source of a fourth P-type transistor,
said third P-type transistor having a gate connected with a drain and connected to a gate of said fourth P-type transistor and a drain of a fifth N-type transistor, said fourth P-type transistor having a drain connected to a drain of a sixth N-type transistor,
a source terminal of said first N-type transistor and a source terminal of said second N-type transistor being connected together to a drain of a seventh N-type transistor,
each of said fifth, sixth and seventh N-type transistors having a gate connected to an external biasing voltage and a source connected to a second supply voltage.

20. A circuit for voltage clamping as claimed in claim 19, wherein said N-type transistor are NMOS's and said P-type transistors are PMOS'S.

21. A circuit for voltage clamping as claimed in claim 19, wherein said differential amplifier comprises a pair of BiMOS subcircuits,
a first BiMOS subcircuit comprising a first NMOS, a second NMOS and a first NPN bipolar, a gate of said first NMOS being connected with a gate of said second NMOS to form said first gate terminal, said first gate terminal being connected to said input terminal, a source of said first NMOS being connected with a drain of said second NMOS and connected to a base of said first NPN bipolar, a drain of said first NMOS being connected with a collector of said first NPN bipolar to form said first drain terminal, a source of said second NMOS being connected with an emitter of said first NPN bipolar to form said first source terminal,
a second BiMOS subcircuit comprising a third NMOS, a fourth NMOS and a second NPN bipolar, a gate of said third NMOS being connected with a gate of said fourth NMOS to form said second gate terminal, a source of said third NMOS being connected with a drain of said fourth NMOS and connected to a base of said second NPN bipolar, a drain of said third NMOS being connected with a collector of said second NPN bipolar to form said second drain terminal, a source of said fourth NMOS being connected with an emitter of said second NPN bipolar to form said second source terminal.

22. A circuit for voltage clamping comprising a voltage level shifter and an analog buffer,
said voltage level shifter generates a voltage signal which is applied to said analog buffer as an input voltage,
said analog buffer comprising a voltage clamping subcircuit and an output buffer subcircuit, said voltage clamping subcircuit generating a pair of voltages and having a push-pull mechanism to clamp an output voltage to be equal to said input voltage and generate a stable voltage source.

23. A circuit for voltage clamping as claimed in claim 22, wherein said voltage level shifter comprises
a differential pair comprising a first transistor and a second transistor,
a gate of said first transistor being connected to an input terminal, said differential pair having sources connected to a third transistor which is connected to a second supply voltage and being gate-controlled by an external biasing voltage,
a fourth transistor being connected between a first supply voltage and a drain of said first transistor,
a fifth transistor being connected between said first supply voltage and a drain of said second transistor,
said fourth and fifth transistors being gate-controlled by the drain of said first transistor,
an input stage comprising a first load and a second load, said first load being connected between the drain of said second transistor and said second supply voltage and generating a trigger point voltage signal to be applied to a gate of said second transistor, said second load being connected between the drain of said first transistor and said second supply voltage, a terminal being connected to the drain of said second transistor to provide said voltage signal for clamping.

24. A circuit for voltage clamping as claimed in claim 23, wherein said first, second and third transistors are NMOS transistors, said fourth and fifth transistors are PMOS transistors.

25. A circuit for voltage clamping as claimed in claim 23, wherein said first load comprising a sixth transistor and a seventh transistor connected in series with a drain from each transistor as a first common node, a gate of said sixth transistor and a gate of said seventh transistor being connected to said first common node, said first common node generating said trigger point voltage to the gate of said second transistor, said second load comprising an eighth transistor and a ninth transistor connected in series with a drain from each transistor as a second common node, a gate of said eighth transistor and a gate of said ninth transistor being connected to said second common node.

26. A circuit for voltage clamping as claimed in claim 23, wherein said first load being a first Schmitt trigger and having an output terminal connected to the gate of said second transistor, said second load is a second Schmitt trigger having an output terminal connected to input gates thereof.

27. A circuit for voltage clamping as claimed in claim 26, wherein said first Schmitt trigger comprises a sixth transistor of P-type device, a seventh transistor of N-type device and an eighth transistor of N-type device connected in series with a first common node between said sixth transistor and seventh transistor and a second common node between said seventh transistor and eighth transistor, said sixth, seventh, and eighth transistors forming a current path between the drain of said second transistor and said second supply voltage, a ninth transistor connected between the drain of said second transistor and said second common node, said sixth, seventh, eighth and ninth transistors having gates all connected together to said first common node between said sixth transistor and seventh transistor and to the gate of said second transistor to provide said trigger point voltage signal.

28. A circuit for voltage clamping as claimed in claim 23, wherein said second load further comprises a transistor as a voltage splitter with a gate connected to the drain of said second transistor.

29. A circuit for voltage clamping comprising a pull-up voltage clamping subcircuit and a pull-down voltage clamping subcircuit to provide a clean power supply, said pull-up voltage clamping subcircuit comprising a first P-type transistor, a first N-type transistor and a first diode, said first diode having a P side connected to a first supply voltage and an N side connected with a drain of said first N-type transistor and a gate of said first P-type transistor, said first N-type transistor having a gate connected to a first clamping voltage, said first P-type transistor having a source connected to said first supply voltage, a source of said first N-type transistor and a drain of said first P-type transistor being connected together to a first capacitor to provide a first terminal of said clean power supply, said pull-down voltage clamping subcircuit comprising a second P-type transistor, a second N-type transistor and a second diode, said second diode having an N side connected to a second supply voltage and a P side connected with a drain of said second P-type transistor and a gate of said second N-type transistor, said second P-type transistor having a gate connected to a second clamping voltage, said second N-type transistor having a source connected to said second supply voltage, a drain of said second N-type transistor and a source of said second P-type transistor being connected together to a second capacitor to provide a second terminal of said clean power supply.

30. A circuit for voltage clamping according to claim 29, wherein said P-type transistors are PMOS's and said N-type transistors are NMOS'S.

31. A circuit for voltage clamping according to claim 29 further comprising a first noise filtering circuit and a second noise filtering circuit, said first noise filtering circuit comprising a first resistor coupled between said first supply voltage and a third capacitor, a second resistor having a first terminal connected with said first resistor and said third capacitor, and having a second terminal connected to the gate of said first N-type transistor to provide said first clamping voltage, said second noise filtering circuit comprising a third resistor coupled between said second supply voltage and a fourth capacitor, a fourth resistor having a first terminal connected with said third resistor and said fourth capacitor, and having a second terminal connected the gate of said second P-type transistor to provide said second clamping voltage.

* * * * *